United States Patent
Tanaka et al.

(10) Patent No.: US 8,217,716 B2
(45) Date of Patent: Jul. 10, 2012

(54) BIAS CIRCUIT, HIGH-POWER AMPLIFIER, AND PORTABLE INFORMATION TERMINAL

(75) Inventors: Satoshi Tanaka, Tokyo (JP); Kyoichi Takahashi, Tokyo (JP); Masatoshi Hase, Kodaira (JP); Masahiro Ito, Tachikawa (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 12/732,383

(22) Filed: Mar. 26, 2010

(65) Prior Publication Data

US 2010/0301935 A1    Dec. 2, 2010

(30) Foreign Application Priority Data

May 29, 2009    (JP) ................. 2009-130299

(51) Int. Cl.
*H03G 9/00*   (2006.01)
*H03G 3/10*   (2006.01)
(52) U.S. Cl. ........................ 330/133; 330/285
(58) Field of Classification Search .................. 330/133, 330/285, 297
See application file for complete search history.

(56) References Cited

U.S. PATENT DOCUMENTS 6,492,872 B1   12/2002  Fujioka et al.
7,345,547 B2 *  3/2008  Wang et al. ................. 330/285

FOREIGN PATENT DOCUMENTS

JP    2001-102881 A    4/2001

* cited by examiner

*Primary Examiner* — Robert Pascal
*Assistant Examiner* — Khiem Nguyen
(74) *Attorney, Agent, or Firm* — Mattingly & Malur, PC (57) ABSTRACT

To provide a bias circuit for gain control that can reduce gain variation at low-power output, facilitate setting of output power, and is unlikely to be affected by variation in element values and variations among products. Use in an HPA having three bias circuits serially-connected is assumed. Current of the third bias circuit is varied with a square-law characteristic. The square-law characteristic is amplified by a buffer amplifier including a linear amplifier and a peripheral circuit thereof. Output current of the third bias circuit varies depending on a current drivability coefficient of the diode-connected FET branched from the connection point between a constant current source and the linear amplifier. The output current of the third bias circuit is controlled by providing a circuit that draws a certain amount of current from the current flowing in the FET.

7 Claims, 11 Drawing Sheets

BIAS CIRCUIT, HIGH-POWER AMPLIFIER, AND PORTABLE INFORMATION TERMINAL

CROSS-REFERENCE TO RELATED APPLICATION

The disclosure of Japanese Patent Application No. 2009-130299 filed on May 29, 2009 including the specification, drawings and abstract is incorporated herein by reference in its entirety.

BACKGROUND OF THE INVENTION

The present invention relates to a method of suppressing variation of control voltage-output power characteristic of a multistage bias circuit with regard to high-frequency power of a wireless communication device, and particularly to a method of suppressing variations among products of control voltage-output power characteristic due to temperature variation or process variation.

Figure 1:
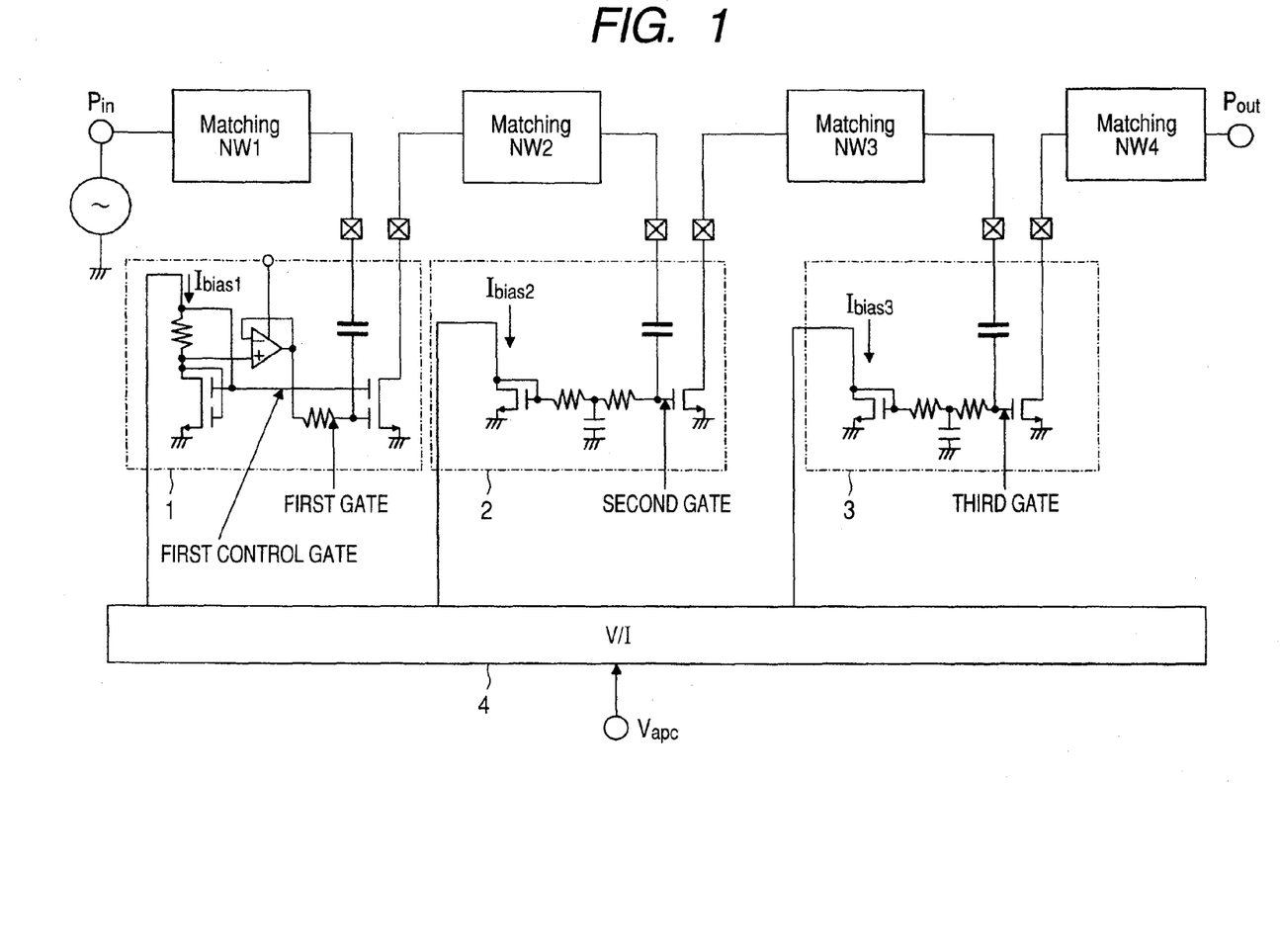
FIG. 1 is a block diagram illustrating a three-stage bias circuit, which is an example of a conventional multistage power amplifier.

Traditionally, power amplification modules equipped with a variable gain function that makes the output power variable by changing the bias condition of a multistage power amplifier have been widely applied to portable wireless communication devices. One of the problems with the multistage power amplifier is drastic change of control voltage-output power characteristic nearby the threshold voltage of a transistor. FIG. 1 illustrates an example of a conventional multistage power amplifier.

Figure 2A:
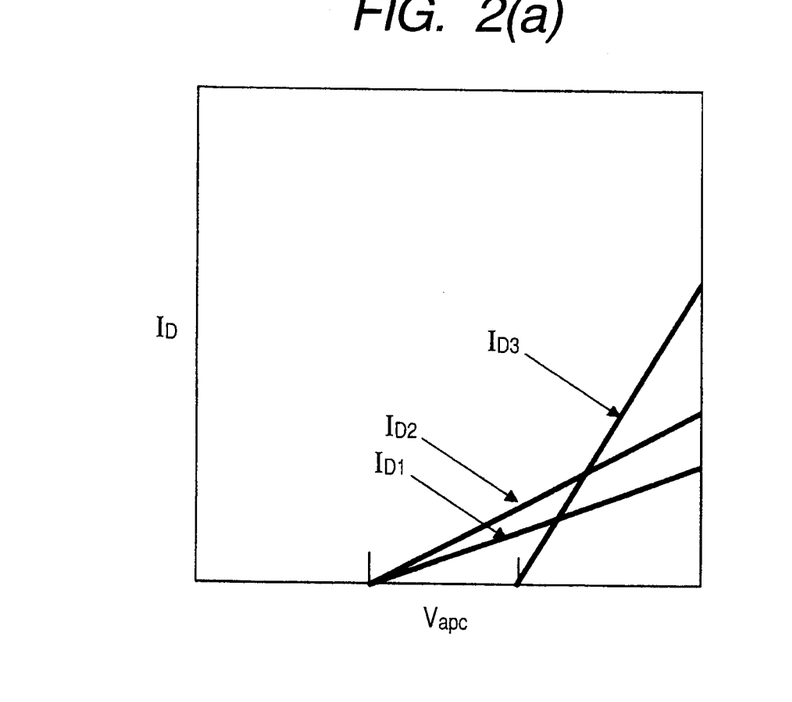
FIGS. 2(A) and 2(B) are graphs illustrating variations of drain drive currents $I_{D1}$, $I_{D2}$ and $I_{D3}$, and the three-stage bias circuit $P_{out}$ against bias voltage $V_{apc}$ when being controlled by the bias circuit of FIG. 1.
Figure 2B:
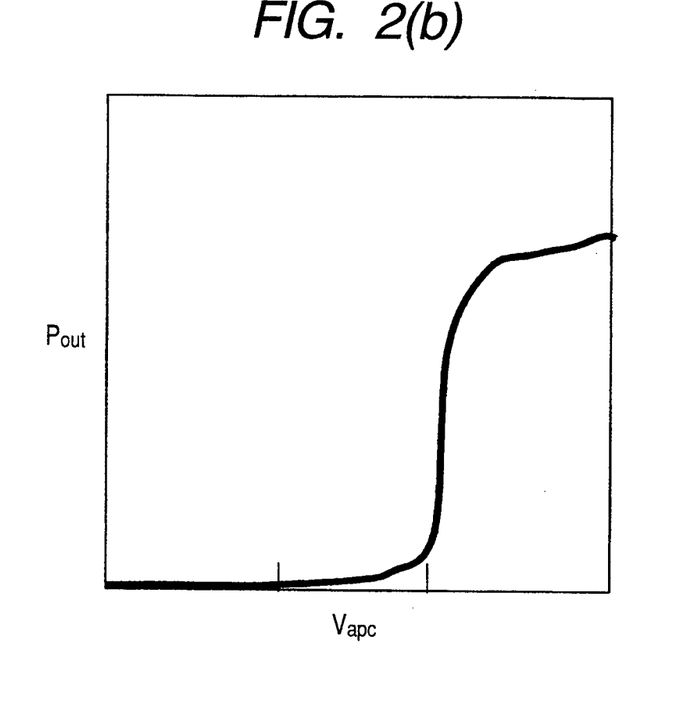

FIG. 1 is a block diagram showing a three-stage bias circuit, which is an example of a conventional multistage power amplifier. In addition, FIGS. 2(a) and 2(b) are graphs representing the variation of bias voltage $V_{apc}$, drain drive current $I_{D1}$, $I_{D2}$ and $I_{D3}$, and the three-stage bias circuit $P_{out}$ when controlled by the bias circuit of FIG. 1. Here, the bias voltage $V_{apc}$, is a signal for feedback-controlling a high-frequency detection signal by comparing a transmission request signal and a detection signal.

The three-stage bias circuit includes a first bias circuit 1, a second bias circuit 2 and a third bias circuit 3, which are serially-connected. Matching circuits are coupled between respective bias circuits and at the output side of the third bias circuit 3.

A current mirror circuit is applied to the first bias circuit 1, the second bias circuit 2, and the third bias circuit 3 of the three-stage bias circuit. The bias circuit of each stage is controlled by the electric current output from an APC (automatic power control circuit) 4.

The APC 4 is a control circuit that outputs control current $I_{bias}$ to the bias circuit of each stage as appropriate, after voltage to current conversion of the input $V_{apc}$.

FIG. 2 (a) is a graph illustrating how the drain drive current $I_D$ of each amplifier varies according to the control voltage $V_{apc}$ added to the APC of the three-stage amplifier bias circuit, and FIG. 2 (b) is a graph illustrating how the output $P_{out}$ (in dbm) of the three-stage amplifier bias circuit varies according to the voltage $V_{apc}$ added to the APC of the three-stage amplifier bias circuit.

That is, the APC of the three-stage amplifier bias circuit performs a linear current control of the first and second stages from the start of control. On the other hand, a control that increases the drain drive current $I_D$ later and more steeply than the first and second stages is performed on the third stage after a voltage exceeding a certain level has been added to the control voltage $V_{apc}$ (see FIG. 2 (a)).

Such a control brings about a steep variation at the start-up of the current because mutual conductance (gm) of an FET is proportional to the square root of the drain drive current $I_D$, and the variation becomes approximately linear thereafter. By controlling the output $P_{out}$ of the three-stage amplifier bias circuit in this linear section, it is possible to provide a high-frequency power amplification module having superior control characteristics.

Japanese Patent Laid-Open No. 2001-102881 (Patent Document 1) discloses a method of providing a multistage, high-frequency power amplification module comprising a plurality of serially-connected MOSFETs, which smoothens the gradient of the linear section to improve control characteristics thereof.

However, there remains a problem even if the control characteristics are improved by improving the linear section as disclosed in the patent document 1.

Figure 3A:
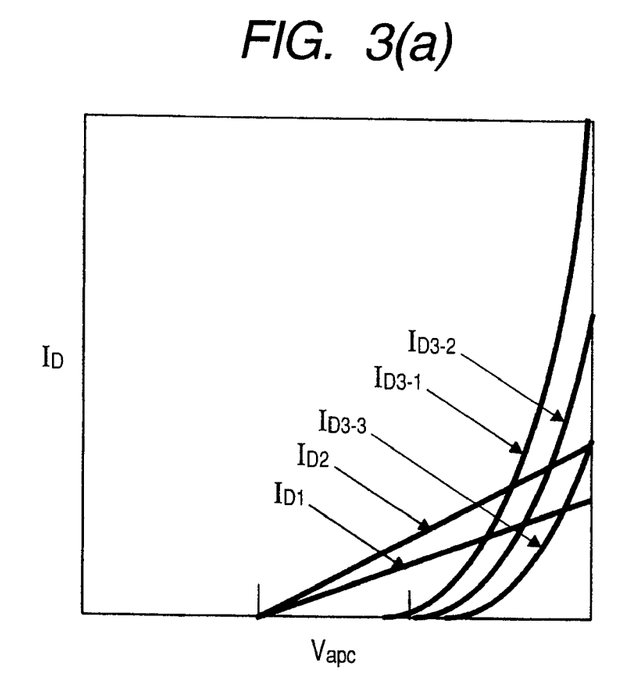
FIGS. 3(A) and 3(B) are graphs illustrating how output $P_{out}$ and drain drive current $I_D$ of the three-stage amplifier bias circuit varies due to variations among products.
Figure 3B:
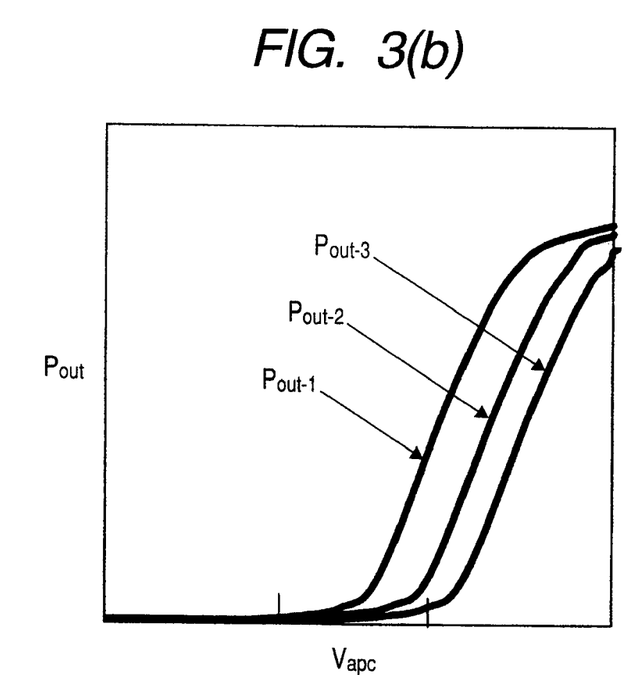

In other words, there exist variations among products at the control in a section accompanied with a steep variation before reaching the linear section, that is, at the start-up. FIGS. 3(a) and 3(b) are graphs illustrating how the output $P_{out}$ of the three-stage amplifier bias circuit varies due to variations among products. FIG. 3 (a) is a graph illustrating how the drain drive current $I_D$ of each amplifier varies according to the control voltage $V_{apc}$ added to the APC of the three-stage amplifier bias circuit, and FIG. 3 (b) is a graph illustrating how the output $P_{out}$ of the three-stage amplifier bias circuit varies according to the voltage $V_{apc}$ added to the APC of the three-stage amplifier bias circuit.

As can be seen in FIG. 3 (a), variations among products first occur in the drain drive current $I_{D3}$ ($I_{D3-1}$, $I_{D3-2}$, $I_{D3-3}$) of the third stage which is output from the APC. With this being the primary factor, errors may also be included in the output $P_{out}$ of the three-stage amplifier bias circuit (see FIG. 3 (b) $P_{out-1}$, $P_{out-2}$, $P_{out-3}$). In other words, control becomes difficult due to overly high sensitivity to bias when setting the output power at a low power level using control bias without being able to sufficiently suppress gain variation.

The present invention has been made in view of the above circumstances and provides a bias circuit for gain control that can reduce gain variation at low-power output, facilitate setting of output power, and is unlikely to be affected by variation in element values and variations among products.

The other purposes and the new feature of the present invention will become clear from the description of the present specification and the accompanying drawings.

SUMMARY OF THE INVENTION

The following explains briefly the outline of a typical invention among the inventions disclosed in the present application.

A bias circuit according to a representative embodiment of the present invention includes a linear amplifier that amplifies current input from an input end; and a resistor coupled to a connection point between the input end and the linear amplifier and grounded via a diode-connected first FET, wherein the linear amplifier, together with a peripheral circuit thereof, composes a buffer amplifier including a threshold voltage offset, and the output of the buffer amplifier is coupled to the base terminal of a second FET.

In the bias circuit, influence of undesired components of the bias circuit may be excluded by setting current drivability coefficients of the first FET and the second FET.

In the bias circuit, part of current flowing from the connection point of the resistor and the first FET to the first FET may be drawn.

In the bias circuit, a current mirror circuit may draw part of current flowing in the first FET.

A high-power amplifier according to a representative embodiment of the present invention comprises a plurality of serially-connected bias circuits, wherein the bias circuit according to any one of claims 1 to 4 is used as the last-stage bias circuit of the serially-connected bias circuits.

A portable information terminal using the high-power amplifier falls within the scope of the present invention.

The following explains briefly the effect acquired by the typical invention among the inventions disclosed in the present application.

By applying the bias circuit according to representative embodiment of the present invention to a three-stage bias circuit which is an example of multistage power amplifiers, it becomes possible to vary the voltage added to the third stage gate voltage at low output linearly, and not in a square root manner. Sensitivity to the bias voltage of the output power is thereby suppressed, facilitating output power control using the bias voltage.

In addition, it becomes possible to reduce influence of device variation by modifying the current mirror circuit conventionally used in the bias circuit. Product yield can be improved thereby.

DETAILED DESCRIPTION OF THE PREFERRED EMBODIMENTS

Embodiments of the present invention will be described below, referring to the drawings.

First Embodiment

Figure 4:
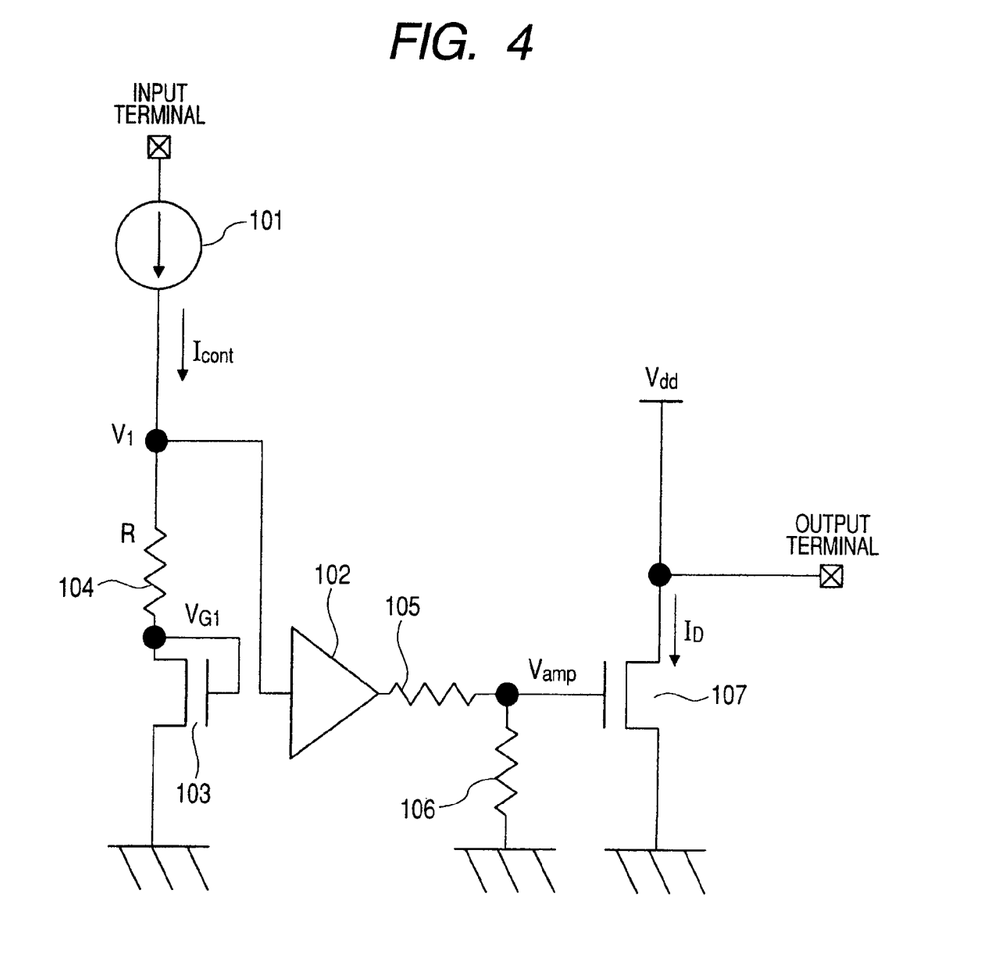
FIG. 4 is a principle diagram of the third stage bias circuit according to a first embodiment of the present invention.
Figure 5:
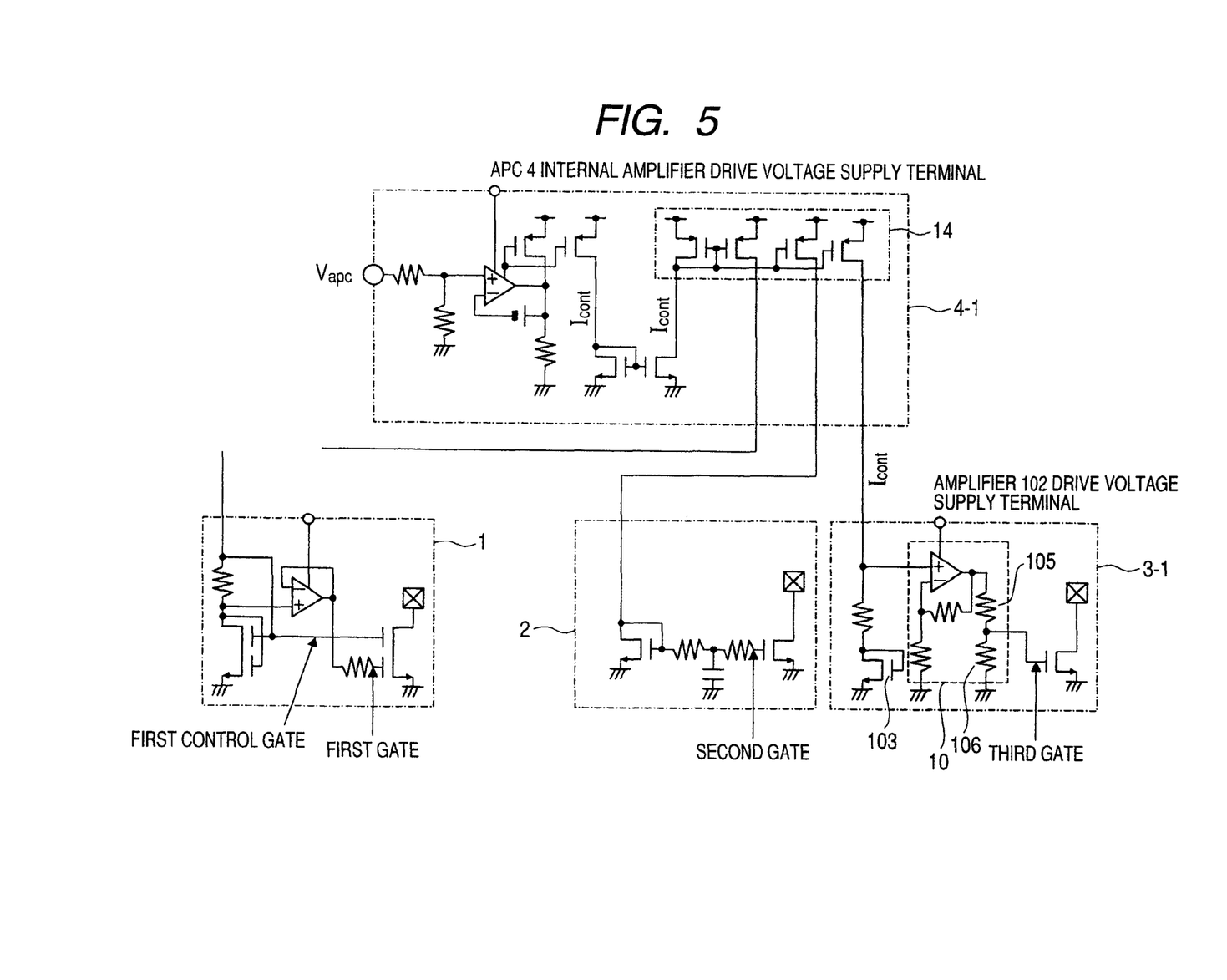
FIG. 5 is a block diagram of a high-power amplifier (HPA) to which the principle of the bias circuit according to the first embodiment of the present invention is applied.

FIG. 4 is a principle diagram of the third stage bias circuit according to a first embodiment of the present invention. In addition, FIG. 5 is a block diagram of a high-power amplifier (HPA) to which the principle of the bias circuit according to the first embodiment of the present invention is applied. A first bias circuit 1 and a second bias circuit 2 are not shown here because they provide bias using a current mirror circuit in a conventional manner. Although internal configuration of the APC 4-1 is described in detail, the basic configuration thereof is that assumed in the conventional APC 4.

The bias circuit according to this embodiment includes a constant current source 101, an amplifier 102, a diode-connected FET 103, a resistor 104, a resistor 105, a resistor 106, and an FET 107.

The constant current source 101 plays the role of controlling the control bias current $I_{cont}$ to a constant current.

The FET 103 is coupled to the connection point between the constant current source 101 and the amplifier 102 in a branched manner. The FET 103, which is diode-connected, has a purpose of drawing a certain amount of the current flowing in the amplifier 102. The FET 103 and the resistor 104 determine the electric potential $V_1$ at the connection point between the constant current source 101 and the amplifier 102. The electric potential at the connection point between the FET 103 and the resistor 104 is denoted as $V_{G1}$.

The amplifier 102 includes a high-frequency power amplifier and peripheral circuits thereof, which amplify the signal that drew the current from the output of the constant current source 101 using the FET 103 or the like. The amplifier 102 is a linear amplifier.

The resistors 105 and 106 divide the voltage of the output of the amplifier 102. Based on the electric potential of the connection point between the resistors 105 and 106, the gate terminal of the FET 107 is controlled. The resistors 105 and 106 have a function of attenuating high frequency signals.

A buffer amplifier 10 having a threshold offset includes the amplifier 102, the diode-connected FET 103, the resistor 104, the resistor 105, and the resistor 106.

The FET 107 has an RF amplification function that amplifies and outputs high frequency signals that are input to the gate.

Using the principle diagram, how the third stage bias circuit works will be explained.

$V_{G1}$ in the circuit can be calculated by the following equation.

$$V_{G1} = \sqrt{\frac{I_{cont}}{\beta_1}} + V_{th} \qquad \text{[Equation 1]}$$

In the above expression, $I_{cont}$ denotes the current value from the constant current source, and $\beta_1$ denotes the current drivability coefficient of the FET 103. In addition, $V_{th}$ denotes the threshold voltage (temperature-dependent) of the FET 103.

Calculation of $V_{G1}$ also provides the electric potential $V_1$ at the connection point between the constant current source 101 and the amplifier 102.

$$V_1 = R \times I_{cont} + \sqrt{\frac{I_{cont}}{\beta_1}} + V_{th} \qquad \text{[Equation 2]}$$

Here, R denotes the resistance value of the resistor 104.

The value of $V_1$ is directly applied to the gate of the FET 107 by the buffer amplifier 10 (shown in FIG. 5 because peripheral circuits are included) including the amplifier 102 and others. Because $V_{th}$ can be ignored, it can be expressed as follows.

$$V_{amp} = (R \times I_{cont})^2 + 2 \times R \times I_{cont} \times \sqrt{\frac{I_{cont}}{\beta_1}} + \frac{I_{cont}}{\beta_1}$$

$$= R^2 \times I_{cont}^2 + 2 \times R \times I_{cont}^{\frac{3}{2}} \times \frac{1}{\sqrt{\beta_1}} + \frac{I_{cont}}{\beta_1}$$

[Equation 3]

Based on the foregoing, $I_D$ can be calculated from the current drivability coefficient $\beta_2$ of the FET 107 as follows.

$$I_D = \beta_2 \times R^2 \times I_{cont}^2 + \frac{2 \times \beta_2 \times R}{\sqrt{\beta_1}} \times I_{cont}^{\frac{3}{2}} + \frac{\beta_2}{\beta_1} \times I_{cont}$$

[Equation 4]

The above-mentioned $\beta_1$ and $\beta_2$ can be calculated by the expression of a general current drivability coefficient.

$$\beta = C_{ox}\mu \frac{W}{l}$$

[Equation 5]

Here, $C_{ox}$ denotes the oxidized film capacitance per unit area, $\mu$ denotes the electron mobility speed, W denotes the gate width, and I denotes the gate length.

Further discussion of (Equation 4) will be provided below.

In (Equation 4), the first term ($\beta_2 \times R^2 \times I_{cont}^2$) is the square-law characteristic. The second and third terms express undesired terms (undesired components). The undesired components become dominant over $I_D$ when $I_{cont}$ is small, in other words, immediately after start-up of the constant current source 101 of the third bias circuit 3-1, which is not desired.

The inventors conceived a method of excluding such undesired components from (Equation 4), and derived the present invention. That is, undesired components can be reduced by increasing the current drivability coefficient $\beta_1$ of the FET 103 (=increase the size of the FET 103) to increase the denominator of the second and the third terms.

In other words, the current drivability coefficient $\beta_1$ is increased by increasing each parameter in the numerator of (Equation 5) in the FET 103, and decreasing the gate length I which is a parameter in the denominator. Undesired components can be excluded thereby.

The high-power amplifier (HPA) of FIG. 5 directly uses the above principle. Note that there may be a case in the followings where description is provided with the configuration of the output terminal side of FIG. 4 omitted. The matching circuit is omitted in the present drawing.

The APC 4-1 supplies $I_{cont}$ according to the above (Equation 4). As for this supply, a current mirror circuit 14 in the APC 4-1 plays the role of the constant current source 101.

As has been already described above, this HPA has its characteristic in the third bias circuit 3-1. Additionally, the third bias circuit 3-1 includes, on as-is basis, the content of the principle diagram shown in FIG. 4.

The steepness of the gain against the control voltage of the third bias circuit 3-1 can be suppressed thereby. An ideal bias circuit can be provided by increasing the current drivability coefficient $\beta_1$ of the FET 103 in this manner.

Second Embodiment

A second embodiment of the present invention will be described next.

The object of the first embodiment is to exclude undesired components of the bias circuit by increasing the current drivability coefficient $\beta_1$ of the FET 103 as described above. Attention has been paid on its feasibility by increasing each parameter in the numerator and decreasing the parameter in the denominator of (Equation 5).

However, these parameters depend on the physical size of devices such as the gate width W or the gate length I. Difficulty in design exists in that characteristic of the bias circuit largely depends on the physical size of the device.

Therefore, it is an object of the second embodiment to exclude undesired components of the bias circuit without depending on device size.

Figure 6:
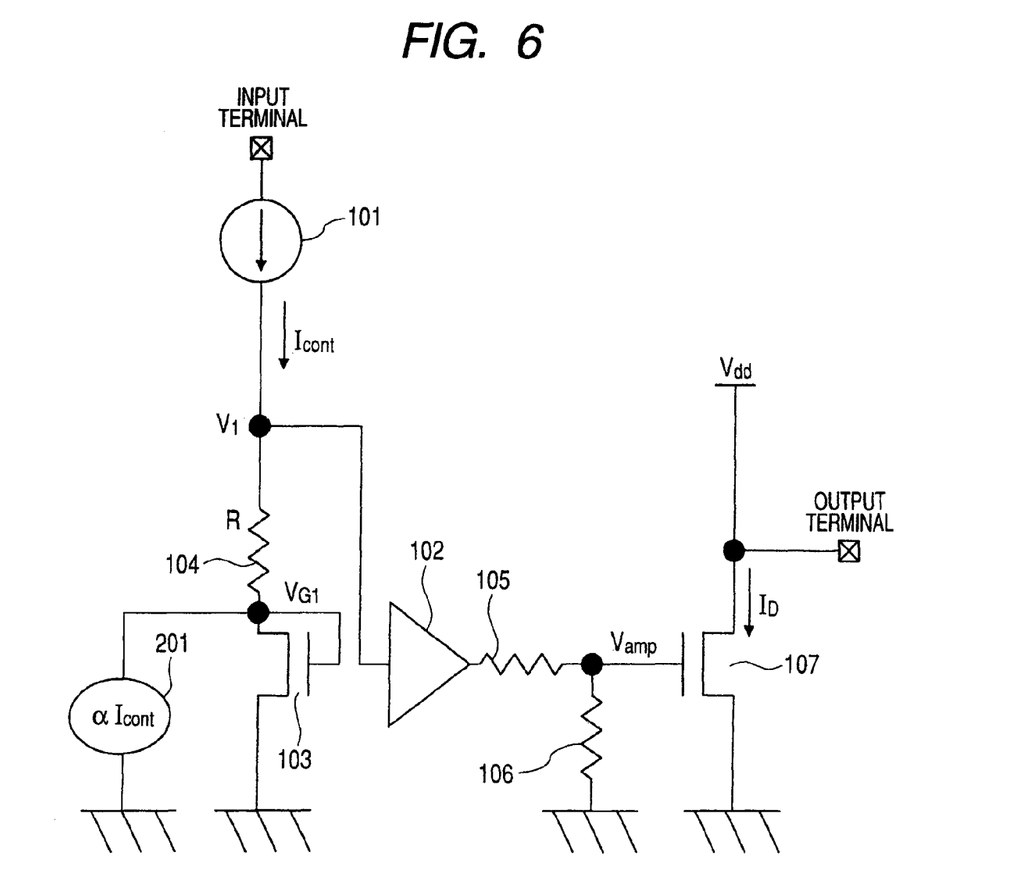
FIG. 6 is a principle diagram of the third stage bias circuit according to a second embodiment of the present invention.

FIG. 6 is a principle diagram of the third stage bias circuit according to the second embodiment of the present invention. This drawing differs from FIG. 4 in that an adjustment circuit 201 is included.

The adjustment circuit 201 draws current which is proportional to the input current from the current flowing in the diode-connected FET 103. Accordingly, the adjustment circuit 201 is coupled to the connection point between the diode-connected FET 103 and the resistor 104 in a branched manner.

A specific configuration of the adjustment circuit 201 will be described below.

The ratio of the drawn current to be drawn by the adjustment circuit 201 from the input current flowing in the FET 103 is defined as a (0<a<1).

First, operation of the third stage bias circuit will be explained using the principle diagram, similarly as the first embodiment.

$V_{G1}$ in this circuit can be calculated by the following equation.

$$V_{G1} = \sqrt{\frac{(1-\alpha) \times I_{cont}}{\beta_1}} + V_{th}$$

[Equation 6]

When $V_{G1}$ is calculated, the electric potential $V_1$ at the connection point between the constant current source 101 and the amplifier 102 can also be calculated, as with the first embodiment.

$$V_1 = R \times I_{cont} + \sqrt{\frac{(1-\alpha) \times I_{cont}}{\beta_1}} + V_{th}$$

[Equation 7]

In this case, the voltage applied to the gate terminal of the FET 107 is given as follows.

$$V_{amp} = R^2 \times I_{cont}^2 + 2 \times R \times I_{cont} \times \sqrt{\frac{(1-\alpha) \times I_{cont}}{\beta_1}} + \frac{(1-\alpha) \times I_{cont}}{\beta_1}$$

$$= R^2 \times I_{cont}^2 + \frac{2 \times R \times \sqrt{(1-\alpha)} \times I_{cont}^{\frac{3}{2}}}{\sqrt{\beta_1}} + \frac{(1-\alpha) \times I_{cont}}{\beta_1}$$

[Equation 8]

Based on the foregoing, $I_D$ can be calculated as follows from the current drivability coefficient $\beta_2$ of the FET 107.

$$I_D = R^2 \times \beta_2 \times I_{cont}^2 + \quad \text{[Equation 9]}$$
$$\frac{2 \times \beta_2 \times R \times \sqrt{(1-\alpha)}}{\sqrt{\beta_1}} \times I_{cont}^{\frac{3}{2}} + \frac{\beta_2 \times (1-\alpha)}{\beta_1} \times I_{cont}$$

Also in the second embodiment, the first term of the right side is the ideal component, whereas the second and the third terms are undesired components.

Now attention should be paid to variation of the entire bias circuit caused by the value of a of the adjustment circuit 201.

Figure 7:
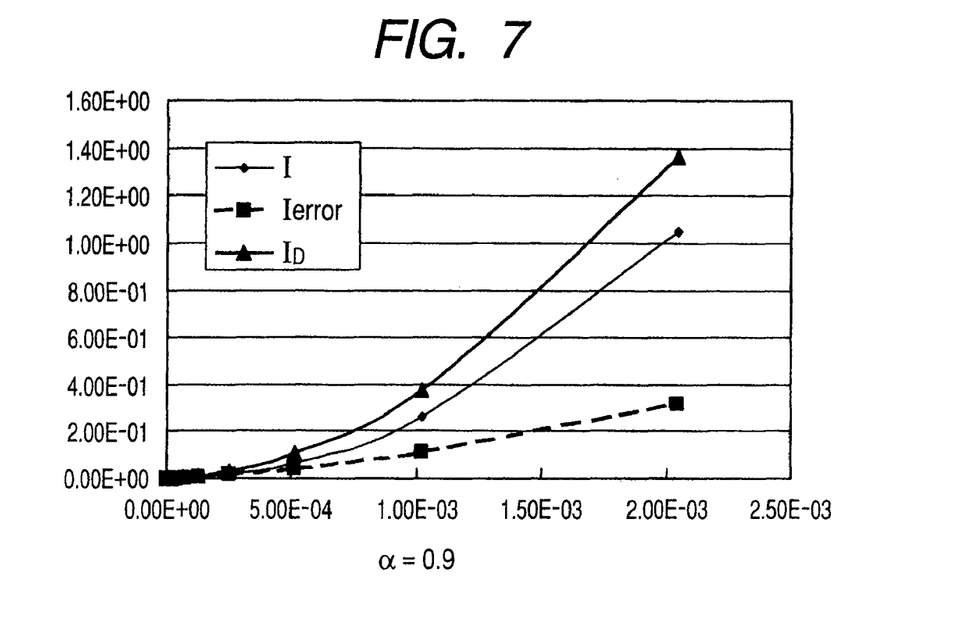
FIG. 7 is a graph illustrating magnitude of each term of the current $I_D$ when a=0.9 in the second embodiment of the present invention.
Figure 8:
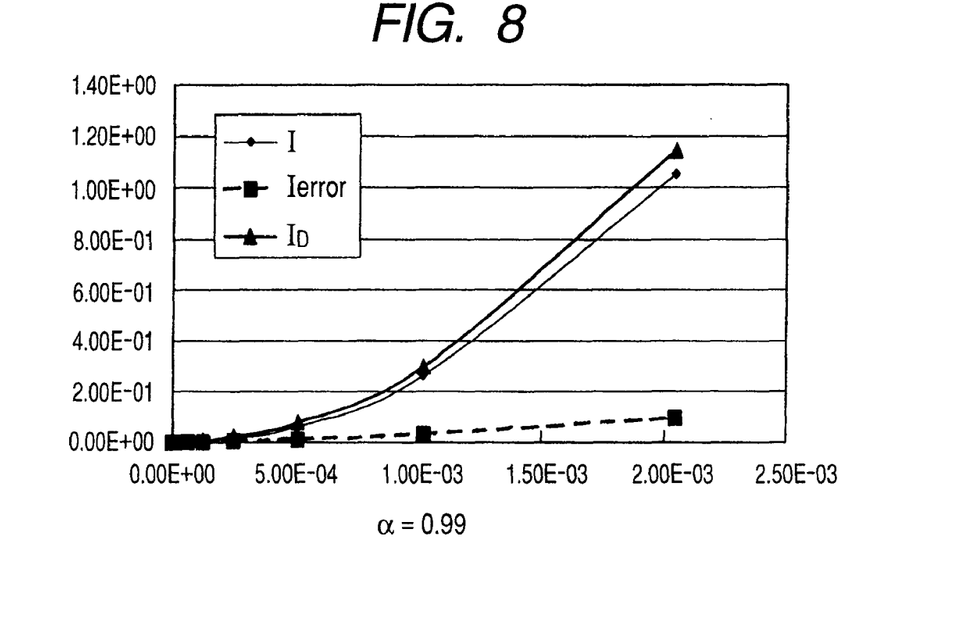
FIG. 8 is a graph illustrating magnitude of each term of the current $I_D$ when a=0.99 in the second embodiment of the present invention.

FIG. 7 is a graph illustrating magnitude of each term of the current $I_D$ when a=0.9 in the second embodiment of the present invention, and FIG. 8 is a graph illustrating magnitude of each term of the current $I_D$ when a=0.99.

In each drawing, three parameters I, $I_{error}$, and $I_D$ are described. I denotes the ideal component of the first term of the right side of (Equation 9). $I_{error}$ denotes the sum of the second and the third terms of the right side of the same equation. $I_D$ denotes $I_D$ of the left side of (Equation 9).

The smaller the numerator of the second and the third terms of (Equation 9), the smaller undesired components of $I_D$ become. Therefore, it is obvious from FIGS. 7 and 8 that a more ideal situation (first term) is realized as a approaches "1".

Figure 9:
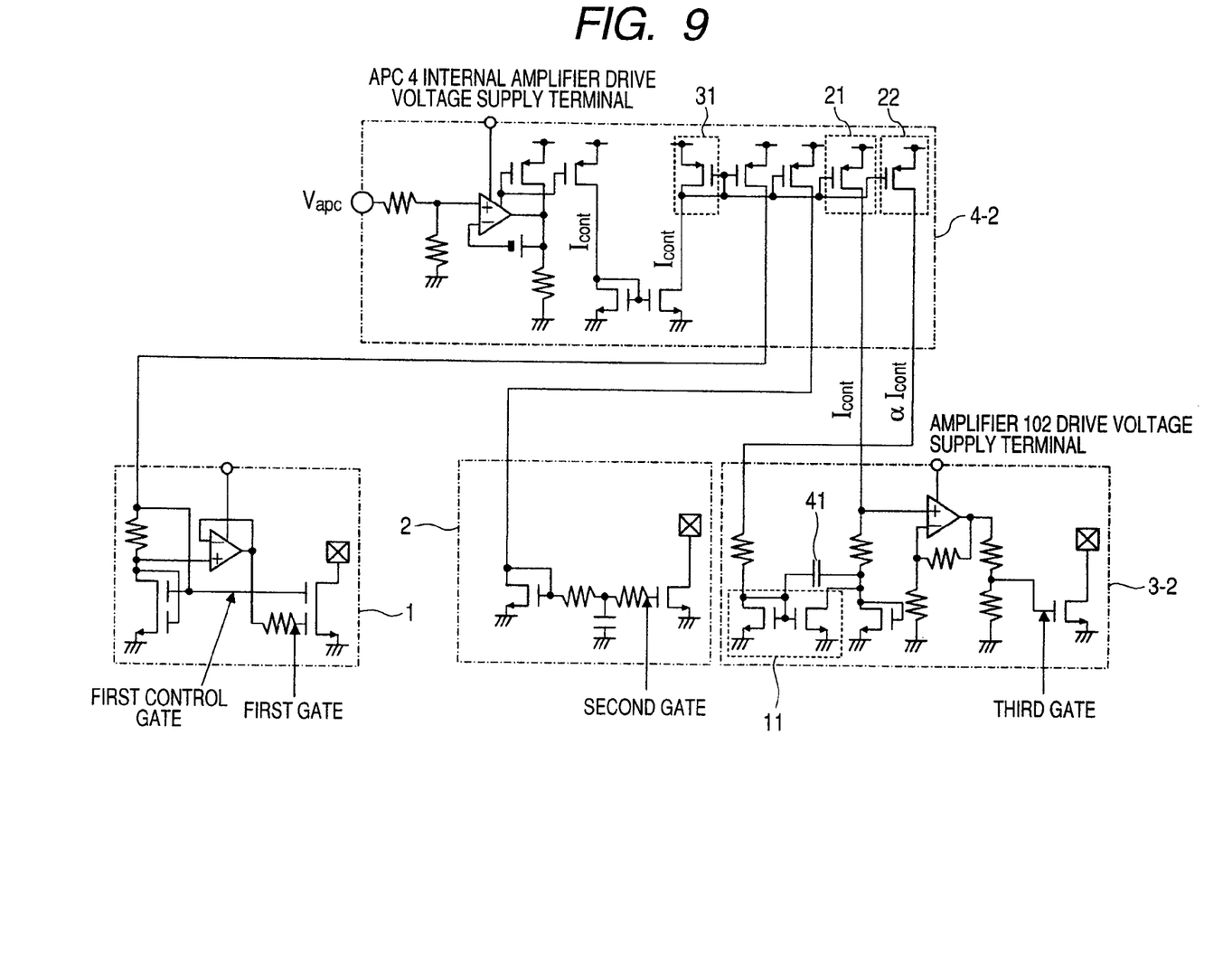
FIG. 9 is a block diagram of a high-power amplifier (HPA) to which the principle of the bias circuit according to the second embodiment of the present invention is applied.

FIG. 9 is a block diagram of a high-power amplifier (HPA) to which the principle of the bias circuit according to the second embodiment of the present invention is applied.

Comparing the HPA of this embodiment with that of the first embodiment, the APC 4-2 and the third bias circuit 3-2 are different.

The third bias circuit 3-2 has two input terminals (here, the amplifier 102 drive voltage supply terminal is excluded) so that $aI_{cont}$, as well as $I_{cont}$ from the constant current source 101 (included in the APC 4-2) can be input.

The third bias circuit 3-2 has a current mirror circuit 11 that processes the input $aI_{cont}$. Using the current mirror circuit 11, $aI_{cont}$ can be drawn from the current flowing in the FET 103.

Furthermore, increase of processing speed can be expected by adding a phase compensation capacity 41 to the gate terminal of the FET included in the current mirror circuit 11. Responsiveness in the time axis actually required for a power amplifier can be secured thereby.

The APC 4-2 differs from the APC 4-1 in that the former outputs $aI_{cont}$. The method of defining a uses pMOSFET21 and pMOSFET22 in the APC 4-2. The gate widths of these pMOSFETs are made completely the same. The ratio of current mirrors coupled below pMOSFET31 in the same APC 4-2 is set to be 1:1. Accordingly, a=1 holds because the subtracted current becomes equal to $I_{cont}$. This causes the current to stop flowing in the FET 103, and therefore the value of a is determined by narrowing the gate width of the left pMOS by several percents, or setting the current mirror ratio to 1:0.95 or the like.

Influence of undesired components of the bias circuit can thereby be excluded without depending on the physical size of the device.

Third Embodiment

A third embodiment of the present invention will be described next.

In the second embodiment, undesired components of $I_D$ are excluded by drawing the current flowing in the FET 103 by the adjustment circuit 201.

In contrast, undesired components are made constant in the third embodiment of the present invention by further drawing an offset current from the adjustment circuit 201. It is an object to realize a more ideal square-law characteristic thereby.

Figure 10:
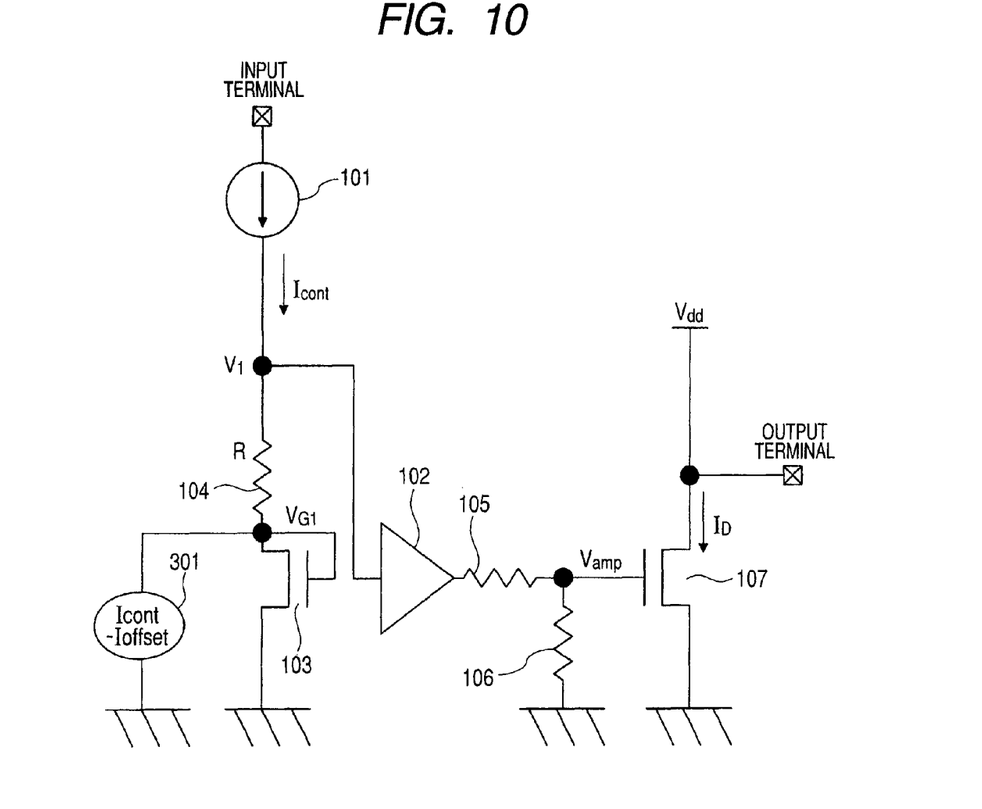
FIG. 10 is a principle diagram of the third stage bias circuit according to a third embodiment of the present invention.

FIG. 10 is a principle diagram of the third stage bias circuit according to the third embodiment of the present invention. This drawing differs from FIG. 6 in that the adjustment circuit 201 is replaced by an adjustment circuit 301.

The adjustment circuit 301 differs from the adjustment circuit 201 in that the input current and the drawn current are not controlled by the ratio, but by drawing current by a value obtained by subtracting a fixed offset value $I_{offset}$ from $I_{cont}$.

Operation of the third stage bias circuit will be explained using this principle diagram.

$V_{G1}$ in the circuit can be calculated by the following equation.

$$V_{G1} = \sqrt{\frac{I_{cont} - (I_{cont} - I_{offset})}{\beta_1}} + V_{th} = \sqrt{\frac{I_{offset}}{\beta_1}} + V_{th} \quad \text{[Equation 10]}$$

The electrical potential $V_1$ at the connection point between the constant current source 101 and the amplifier 102 can also be calculated from this.

$$V_1 = R \times I_{cont} + \sqrt{\frac{I_{offset}}{\beta_1}} + V_{th} \quad \text{[Equation 11]}$$

The voltage applied to the gate terminal of the FET 107 can be similarly calculated.

$$V_{amp} = R^2 \times I_{cont}^2 + 2 \times R \times I_{cont} \times \sqrt{\frac{I_{offset}}{\beta_1}} + \frac{I_{offset}}{\beta_1} \quad \text{[Equation 12]}$$
$$= R^2 \times I_{cont}^2 + 2 \times R \times \frac{I_{cont} \times \sqrt{I_{offset}}}{\sqrt{\beta_1}} + \frac{I_{offset}}{\beta_1}$$

$I_D$ can be calculated from (Equation 12) and the current drivability coefficient $\beta_2$ of the FET 107 as follows.

$$I_D = \quad \text{[Equation 13]}$$
$$R^2 \times \beta_2 \times I_{cont}^2 + 2 \times R \times \beta_2 \times \frac{I_{cont} \times \sqrt{I_{offset}}}{\sqrt{\beta_1}} + \frac{\beta_2}{\beta_1} \times I_{offset}$$

As can be seen, although influence of the second term cannot be completely excluded because $I_{cont}$ remains, influence of the second term can be minimized by the setting of $I_{offset}$, and influence of the third term can also be handled. Handling of $I_{offset}$ during the control improves significantly because $I_{offset}$ is a constant.

Now we consider how to implement this processing in the circuit.

Figure 11:
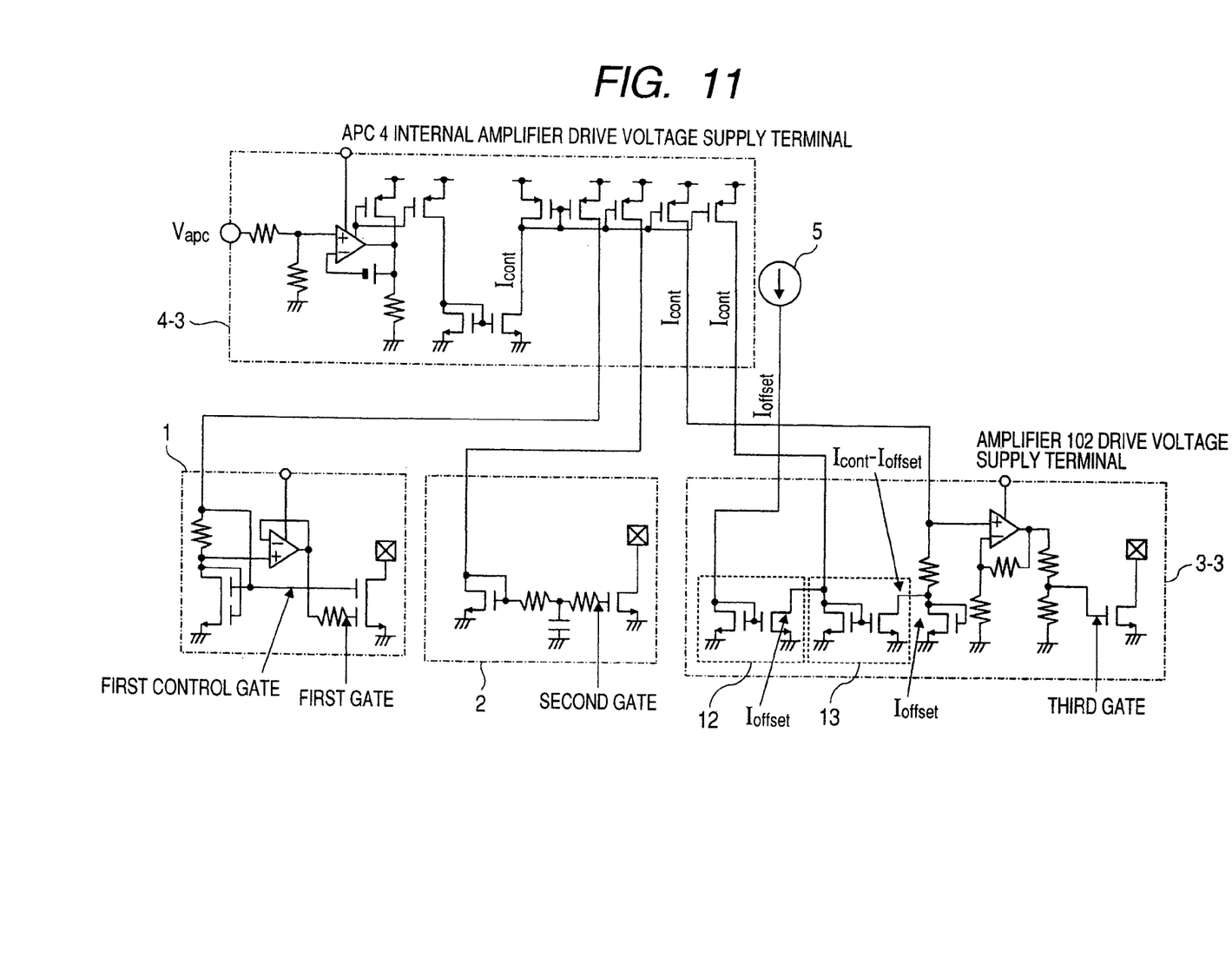
FIG. 11 is a block diagram of a high-power amplifier (HPA) to which the principle of a bias circuit according to the third embodiment of the present invention is applied.

FIG. 11 is a block diagram of a high-power amplifier (HPA) to which the principle of the bias circuit according to the third embodiment of the present invention is applied.

The APC 4-3 and the third bias circuit 3-3 are different in this embodiment. Addition of a constant current source 5 is also characteristic.

The constant current source 5 plays the role of generating $I_{Offset}$ that appears in the above (Equation 10) to (Equation 13).

The third bias circuit 3-3 includes current mirror circuits 12 and 13 in order to realize the principle of FIG. 10.

In the current mirror circuit 12, $I_{Offset}$ from the constant current source 5 is input to the constant current source side (where the gate and the drain are connected) of the current mirror circuit. Because the current of the other terminal (output terminal) is set to $I_{Offset}$ by the current mirror circuit 12, input of the current mirror circuit 13 can be reduced.

$I_{cont}$ generated in the APC 4-3 is input to the input terminal of the constant current source side (where the gate and the drain are coupled) of the current mirror circuit 13. The terminal at the output side of the current mirror circuit 12 is also coupled to the connection terminal to which $I_{cont}$ is input. Accordingly, the effective current that is input to the current mirror circuit 13 is given by $I_{cont}-I_{offset}$. Therefore, the current mirror circuit 13 can draw the current of $I_{cont}-I_{Offset}$ from a signal connected to the output terminal.

$(I_{cont}-I_{Offset})$ in the square root of (Equation 10) can thereby be generated so that this embodiment can be implemented.

Fourth Embodiment

Finally, a case that applies the HPA according to the above-mentioned embodiment to a cellular phone will be described.

Figure 12:
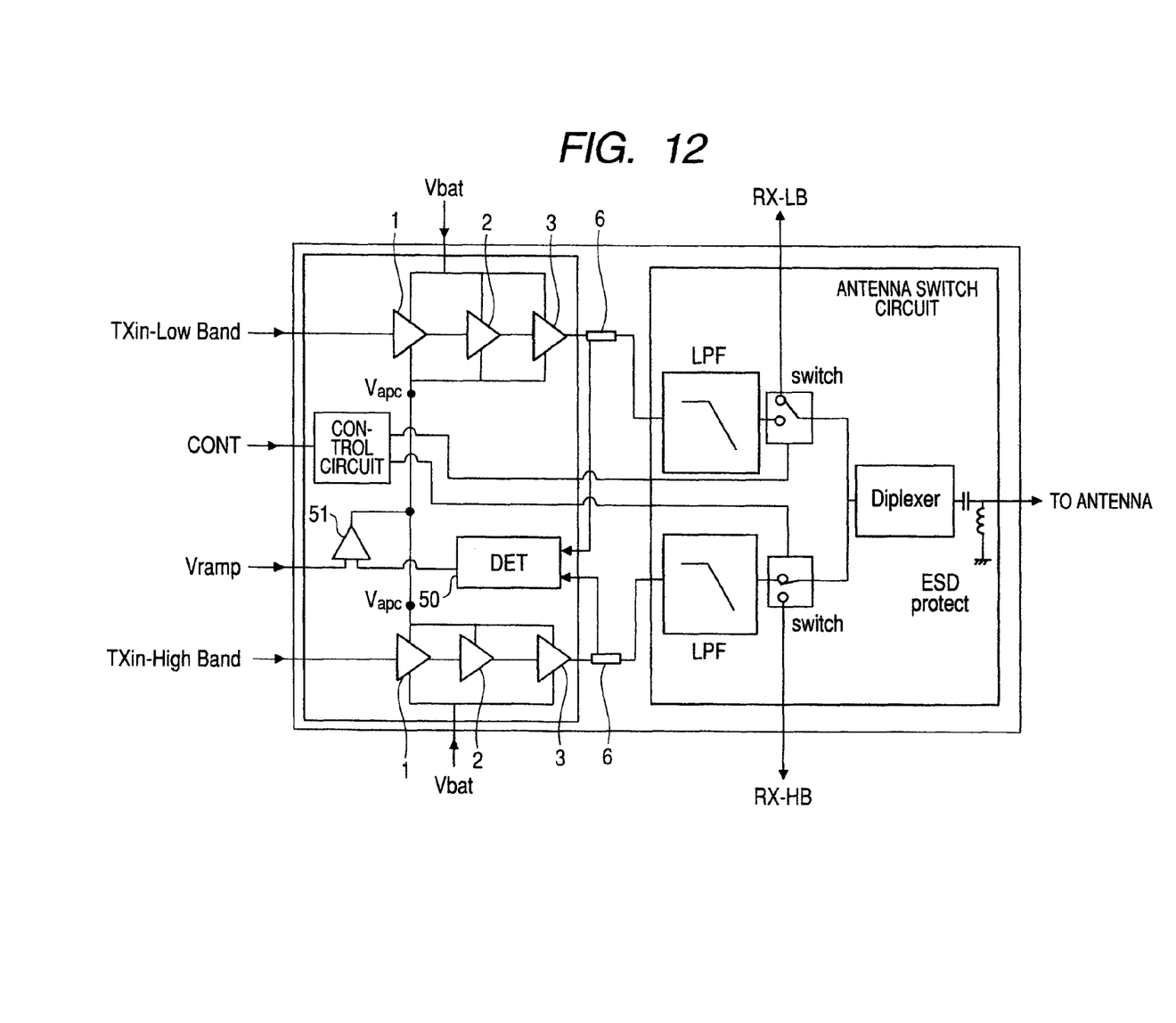
FIG. 12 is a block diagram of a power amplifier according to a fourth embodiment of the present invention.

FIG. 12 is a block diagram of a power amplifier according to a fourth embodiment of the present invention.

The present power amplifier module is provided with two power amplifiers, namely, a Low Band in the 1 GHz band and a High Band in the 2 GHz band. In the drawing, the input terminal of the Low Band is TXin-Low Band, and the input terminal of the High Band is TXin-High Band. In addition, the High Band and the Low Band respectively have, within the antenna switch circuit, an LPF (Low Pass Filter) that removes the high harmonics, a switch that switches transmission and reception, and a diplexer circuit that integrates the signals of both the High Band and the Low Band.

The input provided to these terminals is first amplified by one of the above HPAs including the first bias circuit 1, the second bias circuit 2, and the third bias circuit 3. After amplification by the HPA, the input can be fed back to the control voltage $V_{apc}$ of the power amplifier via a coupler 6, a detector circuit 50, and an error amplifier 51 to accurately output power to the output control voltage $V_{ramp}$.

Although the detector circuit 50 and the error amplifier 51 are illustrated to process both the Low Band and the High Band collectively, there is no problem with dividing the process into two. Accordingly, two inputs may be provided for the output control voltage $V_{ramp}$ of the High Band and the output control voltage $V_{ramp}$ of the Low Band.

The HPA according to the present invention can thus be applied to a power amplifier.

Although the invention made by the inventors has been specifically described based on its embodiments, the present invention is not limited to the foregoing embodiments and it is needless to say that a variety of modification is possible without deviating from its spirit.

The present invention is expected to be applied to power amplifiers for portable information terminals. It is particularly expected that, through application of the present invention, a preferable bias circuit is provided to a power amplifier for GSM that controls the output using control voltage.

However, application of bias circuits of the embodiments for purposes other than those described above is not prohibited. In addition, although it has been assumed in the foregoing description to serially-connect bias circuits in three stages, there is no problem with using a single bias circuit alone. There is also no problem with serially-connecting bias circuits in more stages.

What is claimed is:

1. A bias circuit comprising:
   a linear amplifier that amplifies current input from an input end; and
   a resistor coupled to a connection point between the input end and the linear amplifier and grounded via a diode-connected first FET, wherein
   the linear amplifier, together with a peripheral circuit thereof, comprises a buffer amplifier including a threshold voltage offset, and the output of the buffer amplifier is coupled to a gate terminal of a second FET,
   wherein the second FET has an RF amplification function that amplifies and outputs high frequency signals that are input to the gate terminal of the second FET, and
   an adjustment circuit coupled to the connection point of the resistor and the first FET that draws current proportional to the input current flowing in the first FET.

2. The bias circuit according to claim 1, wherein influence of undesired components of the bias circuit is excluded by setting current drivability coefficients of the first FET and the second FET.

3. A high-power amplifier comprising a plurality of serially-connected bias circuits, wherein the bias circuit according to claim 2 is used as the last-stage bias circuit of the serially-connected bias circuits.

4. The bias circuit according to claim 1, wherein a current mirror circuit draws part of current flowing in the first FET.

5. A high-power amplifier comprising a plurality of serially-connected bias circuits, wherein the bias circuit according to claim 4 is used as the last-stage bias circuit of the serially-connected bias circuits.

6. A high-power amplifier comprising a plurality of serially-connected bias circuits, wherein the bias circuit according to claim 1 is used as the last-stage bias circuit of the serially-connected bias circuits.

7. A portable information terminal that uses the high-power amplifier according to claim 6.

* * * * *